United States Patent
Tsai et al.

(10) Patent No.: US 12,094,995 B2
(45) Date of Patent: Sep. 17, 2024

(54) OPTICAL DEVICE INCLUDING LID HAVING FIRST AND SECOND CAVITY WITH INCLINED SIDEWALLS

(71) Applicant: Advanced Semiconductor Engineering, Inc., Kaohsiung (TW)

(72) Inventors: Chang Chin Tsai, Kaohsiung (TW); Yu-Che Huang, Kaohsiung (TW); Hsun-Wei Chan, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/899,552

(22) Filed: Aug. 30, 2022

(65) Prior Publication Data

US 2022/0416111 A1 Dec. 29, 2022

Related U.S. Application Data (63) Continuation of application No. 16/518,792, filed on Jul. 22, 2019, now Pat. No. 11,430,906.

(60) Provisional application No. 62/703,787, filed on Jul. 26, 2018.

(51) Int. Cl.
*H01L 31/12* (2006.01)

(52) U.S. Cl.
CPC .................. *H01L 31/125* (2013.01)

(58) Field of Classification Search
CPC .. H01L 31/0203; H01L 31/125; H01L 31/167
USPC .......................................................... 257/80
See application file for complete search history.

(56) References Cited

U.S. PATENT DOCUMENTS

| | | | |
|---|---|---|---|
| 2008/0087824 A1* | 4/2008 | Hayashi | G01J 1/04 250/338.1 |
| 2011/0147573 A1 | 6/2011 | Liess et al. | |
| 2012/0228503 A1 | 9/2012 | Nishikawa et al. | |
| 2014/0117201 A1 | 5/2014 | Barlow | |
| 2016/0146639 A1 | 5/2016 | Chan | |
| 2017/0113922 A1* | 4/2017 | Huang | B81C 1/00317 |
| 2018/0087958 A1 | 3/2018 | Shen et al. | |

FOREIGN PATENT DOCUMENTS

| | | |
|---|---|---|
| CN | 101952698 A | 1/2011 |
| CN | 102412336 A | 4/2012 |
| CN | 202548325 U | 11/2012 |
| JP | 2002-062365 A | 2/2002 |
| JP | 2011-203194 A | 10/2011 |
| TW | 201133778 A1 | 10/2011 |

(Continued)

OTHER PUBLICATIONS

Non-Final Office Action for U.S. Appl. No. 16/518,792, issued Sep. 20, 2021, 11 pages.

(Continued)

*Primary Examiner* — Matthew E. Gordon
(74) *Attorney, Agent, or Firm* — FOLEY & LARDNER LLP (57) ABSTRACT

An optical device includes a substrate, an electronic component and a lid. The electronic component is disposed on the substrate. The lid is disposed on the substrate. The lid has a first cavity over the electronic component and a second cavity over the first cavity. The sidewall of the second cavity is inclined.

13 Claims, 6 Drawing Sheets

(56) References Cited

FOREIGN PATENT DOCUMENTS

TW  201135954 A1  10/2011
TW  201323841 A1  6/2013
TW  201814321 A   4/2018

OTHER PUBLICATIONS

Notice of Allowance on U.S. Appl. No. 16/518,792 DTD Apr. 13, 2022.
Office Action for corresponding Taiwanese Patent Application No. 108126596, issued on Jun. 30, 2022, 11 pages.
Search Report (with English translation) for corresponding Taiwanese Patent Application No. 108126596, issued on Jun. 30, 2022, 4 pages.
Office Action for corresponding Taiwanese Patent Application No. 112100259, issued on Jun. 28, 2022, 6 pages.
Search Report (with English translation) for corresponding Taiwanese Patent Application No. 112100259, issued on Jun. 28, 2024, 4 pages.

\* cited by examiner

OPTICAL DEVICE INCLUDING LID HAVING FIRST AND SECOND CAVITY WITH INCLINED SIDEWALLS

CROSS-REFERENCE TO RELATED APPLICATIONS

This application is a continuation of U.S. patent application Ser. No. 16/518,792 filed Jul. 22, 2019, now issued as U.S. Pat. No. 11,430,906, which claims the benefit of and priority to U.S. Provisional Application No. 62/703,787, filed on Jul. 26, 2018, the contents of which are incorporated herein by reference in their entireties.

BACKGROUND

1. Technical Field

The present disclosure relates to an optical device, and more particularly to an optical device including a lid.

2. Description of the Related Art

In an optical device (e.g., light scanning sensor, distance finding sensor, background-light sensing system), light emitters (e.g., vertical-cavity surface-emitting LASER (VCSEL) or light emitting diodes (LED)) and/or light detectors are used. In some optical devices, a lid may be used to protect the light emitter and/or light detector. The lid has one or more openings to expose the light emitting area of the light emitter or the light detecting area of the light detector. It is desirable to provide an optical device having a lid, which can provide a better optical performance without increasing the size of the optical device.

SUMMARY

In accordance with an aspect of the present disclosure, an optical device includes a substrate, an electronic component and a lid. The electronic component is disposed on the substrate. The lid is disposed on the substrate. The lid has a first cavity over the electronic component and a second cavity over the first cavity. The sidewall of the second cavity is inclined.

In accordance another aspect of the present disclosure, an optical device includes a substrate, an electronic component and lid. The electronic component is disposed on the substrate. The lid is disposed on the substrate. The lid has a first cavity over the electronic component and a second cavity over the first cavity. The lid has a top surface facing away from the substrate. The top surface of the lid and a sidewall of the second cavity define an angle greater than 90 degrees.

Common reference numerals are used throughout the drawings and the detailed description to indicate the same or similar components. The present disclosure can be best understood from the following detailed description taken in conjunction with the accompanying drawings.

DETAILED DESCRIPTION

Figure 1A:
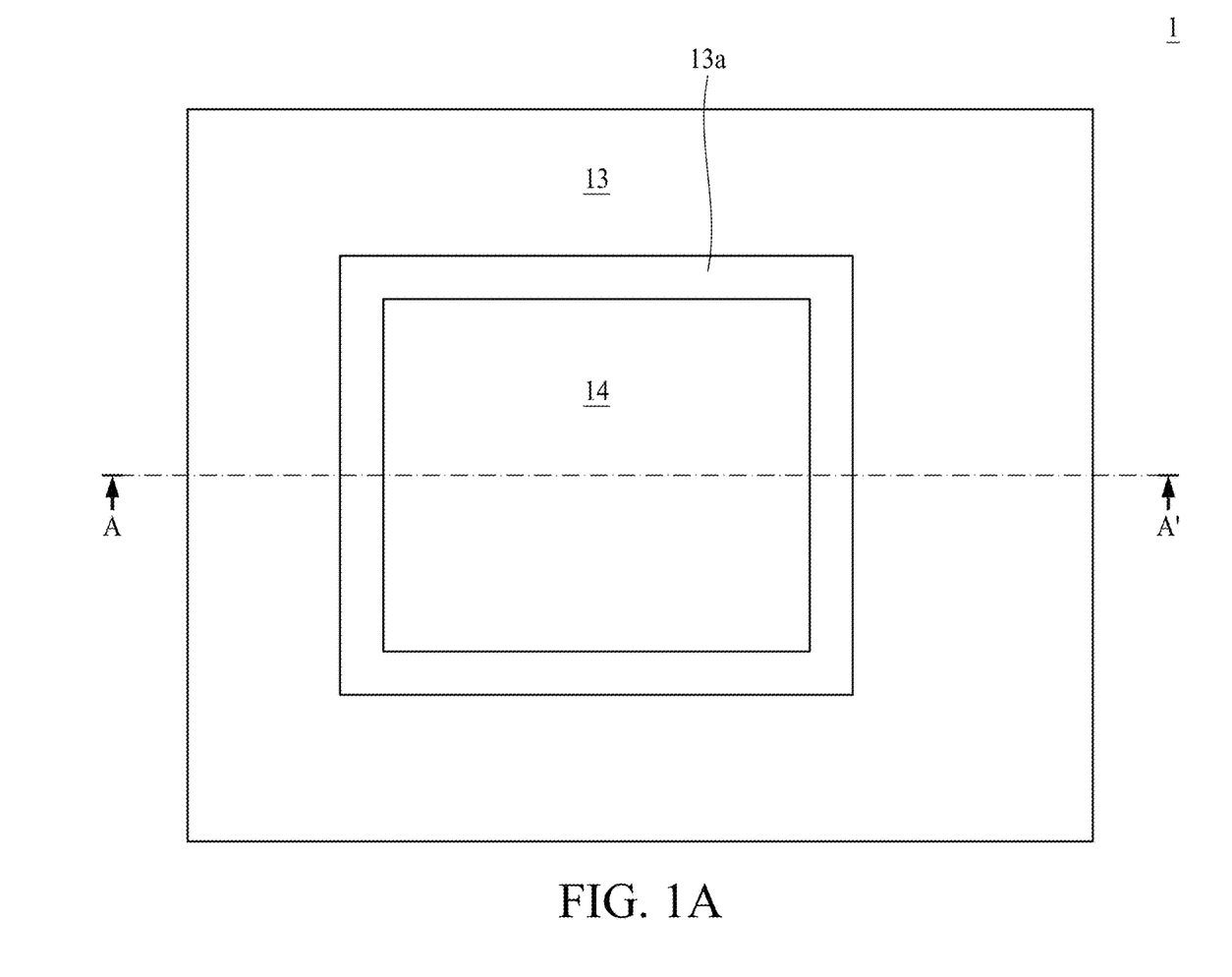
FIG. 1A illustrates a top view of an optical device in accordance with some embodiments of the present disclosure.
Figure 1B:
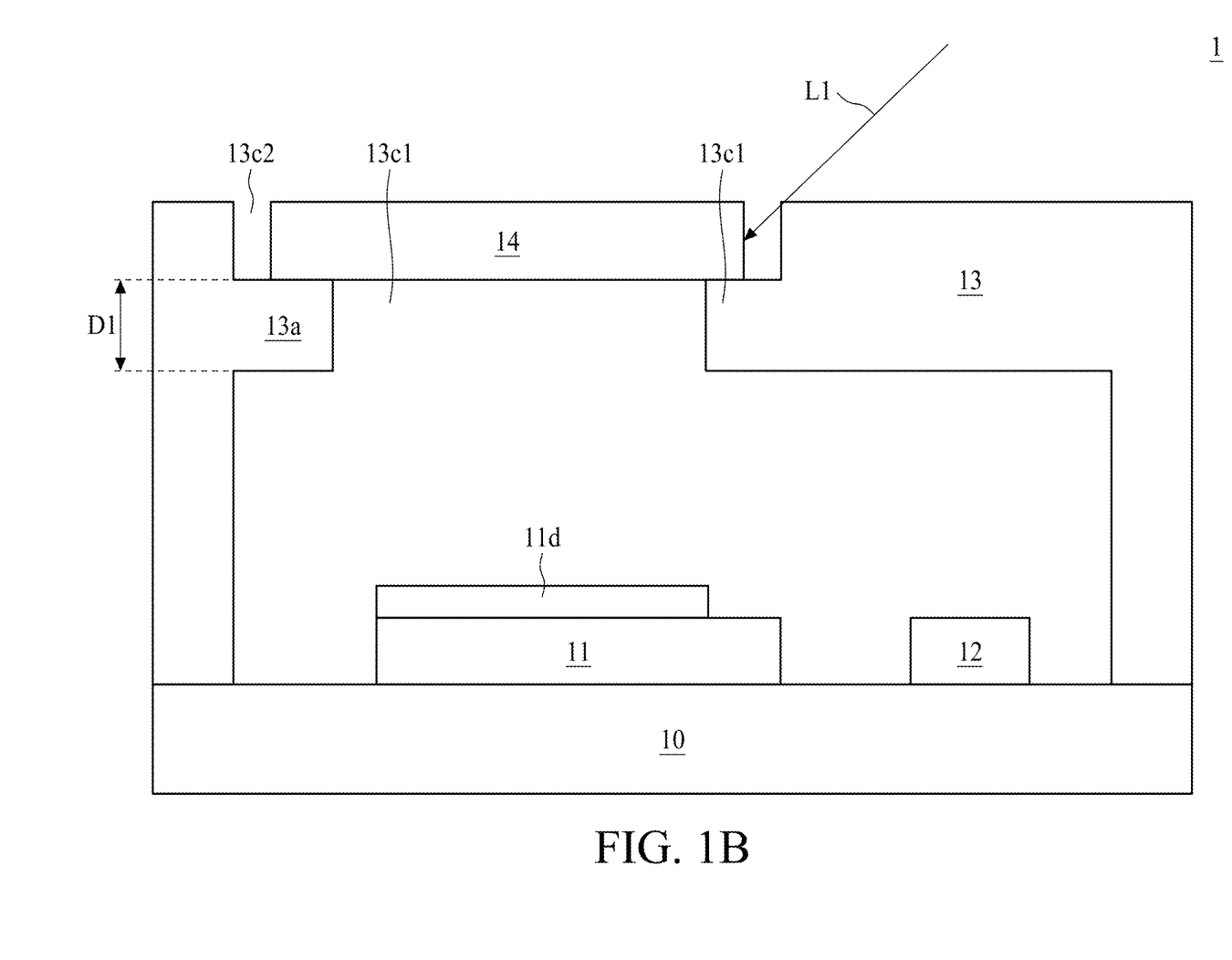
FIG. 1B illustrates a cross-sectional view of an optical device in accordance with some embodiments of the present disclosure.

FIG. 1A illustrates a top view of an optical device 1 in accordance with some embodiments of the present disclosure. FIG. 1B illustrates a cross-sectional view of the optical device 1 in FIG. 1A taken along the line A-A', in accordance with some embodiments of the present disclosure. The optical device 1 includes a substrate 10, electronic components 11 and 12, a lid 13 and a light transmission element 14. In some embodiments, the optical device 1 may be or include a light scanning sensor, a distance finding sensor, a background-light sensing system, a time of flight (ToF) sensor or an ambient light sensor (ALS).

The substrate 10 may include, for example, a printed circuit board, such as a paper-based copper foil laminate, a composite copper foil laminate, or a polymer-impregnated (p.p.) glass-fiber-based copper foil laminate. The substrate 10 may include an interconnection structure, such as a plurality of conductive traces, pads or through vias. In some embodiments, the substrate 10 includes a ceramic material or a metal plate. In some embodiments, the substrate 10 may include an organic substrate or a leadframe. In some embodiments, the substrate 10 may include a two-layer substrate which includes a core layer and a conductive material and/or structure disposed on an upper surface and a bottom surface of the substrate 10. The conductive material and/or structure may include a plurality of traces, pads, or vias.

The electronic component 11 is disposed on the substrate 10 and connected to the substrate 10 for example, by way of flip-chip or wire-bond techniques. In some embodiments, the electronic component 11 is a light detector having a light sensing area 11d facing the light transmission element 14 to receive the light passing through the light transmission element 14. In some embodiments, the light detector may include, for example, a PIN diode (a diode including a p-type semiconductor region, an intrinsic semiconductor region, and an n-type semiconductor region) or a photo-diode or a photo-transistor. In some embodiments, the electronic component 11 can be a microelectromechanical system (MEMS) with the light sensing area 11d thereon. In some embodiments, the electronic component 11 can be a light emitter (e.g., a light-emitting diode (LED), a laser diode, a vertical-cavity surface-emitting Laser (VCSEL) and the like).

The electronic component 12 is disposed on the substrate 10 and connected to the substrate 10 for example, by way of flip-chip or wire-bond techniques. In some embodiments, the electronic component 12 may include a controller, a processor, a memory, an application-specific integrated circuit (ASIC) and the like. The electronic component 12 is configured to receive signal from the electronic component 11 and to process the received signal. In other embodiments, the electronic components 11 and 12 can be integrated into a single die/chip depending on different design specifications.

The lid (or housing) 13 is disposed on the substrate 10. The lid 13 defines a cavity (or opening, aperture) 13c1 over the light sensing area 11d of the electronic component 11. The lid 13 further defines a cavity 13c2 over the cavity 13c1. In some embodiments, a width of the cavity 13c2 is greater than a width of the cavity 13c1. In some embodiments, the width of the cavity 13c1 is equal to or greater than the light sensing area 11d. The lid 13 has a support structure 13a to support the light transmission element 14. In some embodiments, the cavity 13c1 is defined by the support structure 13a.

The light transmission element 14 is disposed within the cavity 13c2 and on the support structure 13a. The light transmission element 14 is configured to allow light with desired wavelength (color) or desired ranges of wavelengths (colors) passing through. In some embodiments, the light transmission element 14 is a light filter to remove (e.g., reflect or absorb) an undesired wavelength or undesired ranges of wavelengths of light. In some embodiments, the light transmission element 14 may include a glass or plastic with a coating thereon.

Figure 2:
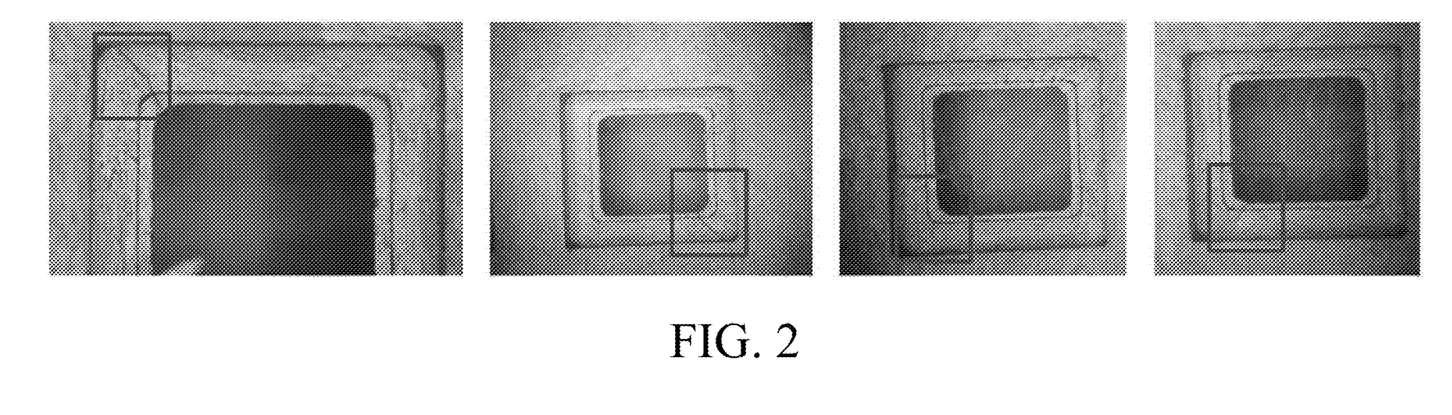
FIG. 2 are images of an optical device in accordance with some embodiments of the present disclosure.

In some embodiments, the thickness of the support structure 13a of the lid 13 is constrained. For example, if the support structure 13a is too thin (e.g., less than 300 micrometer (μm)), the lid 13 may be damaged or crack (as shown in FIG. 2, which shows photos of the optical device 1) during or after reflow process, which may cause a cross-talk issue. For example, undesired light may enter the light sensing area 11d through the crack of the lid 13, which will decrease the signal-to-noise ratio (SNR) of the optical device 1. Therefore, to avoid the crack of the lid 13, a relatively thick support structure 13a is included. However, this will increase the total thickness of the optical device 1, which would hinder the miniaturization of the optical device 1.

In addition, an adhesive (e.g., glue or tape) between the light transmission element 14 and the support structure 13a is included to fasten or fix the light transmission element 14 to the support structure 13a. However, since the adhesive may be uneven, a tilt of the light transmission element 14 would occur. Furthermore, the coating is applied to a top surface, a bottom surface or both surfaces of the light transmission element 14 but is not applied to a lateral surface of the light transmission element after singulation. Therefore, the light may enter the light sensing area 11d through the light path L1, which will decrease the SNR of the optical device 1.

Figure 3A:
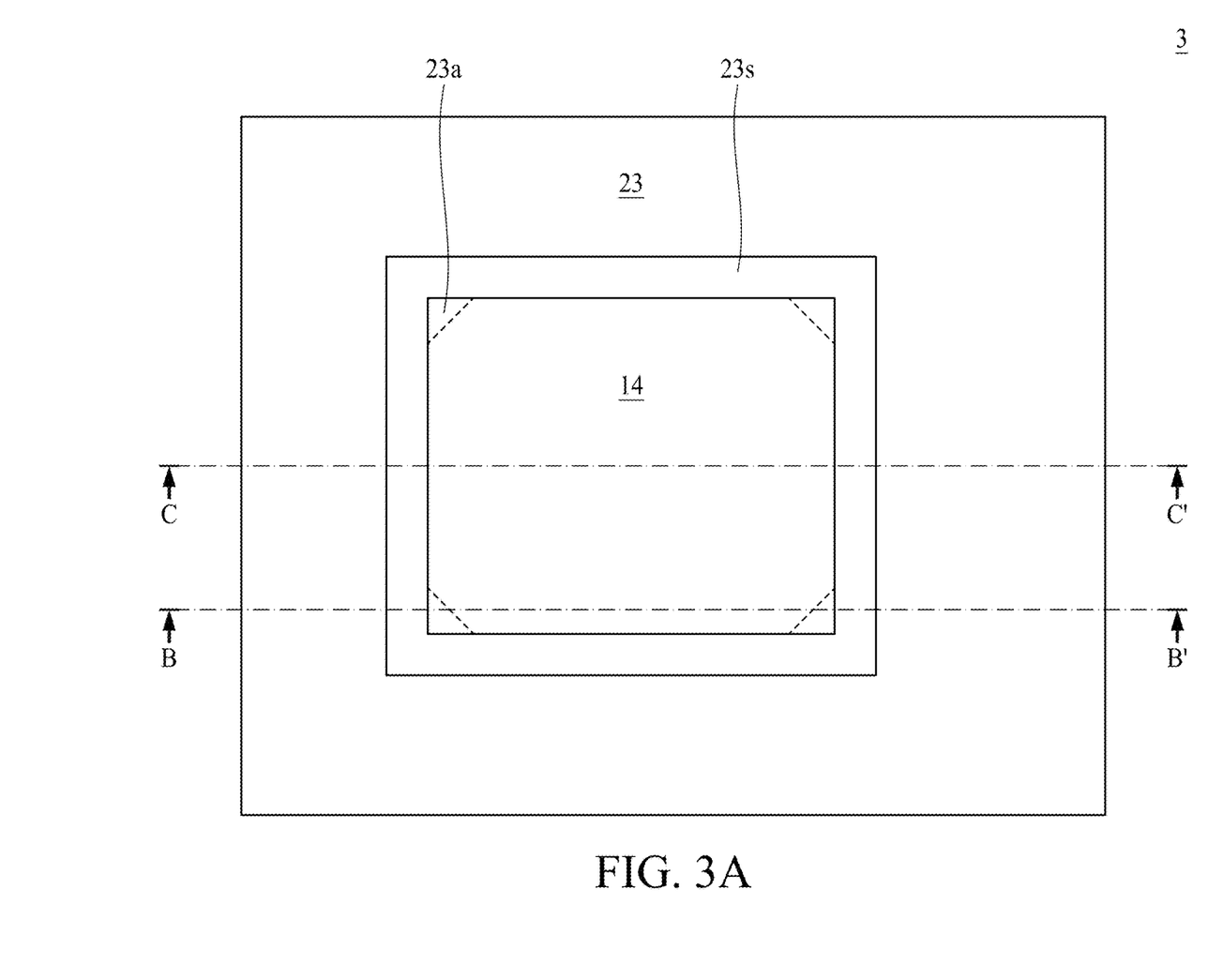
FIG. 3A illustrates a top view of an optical device in accordance with some embodiments of the present disclosure.
Figure 3B:
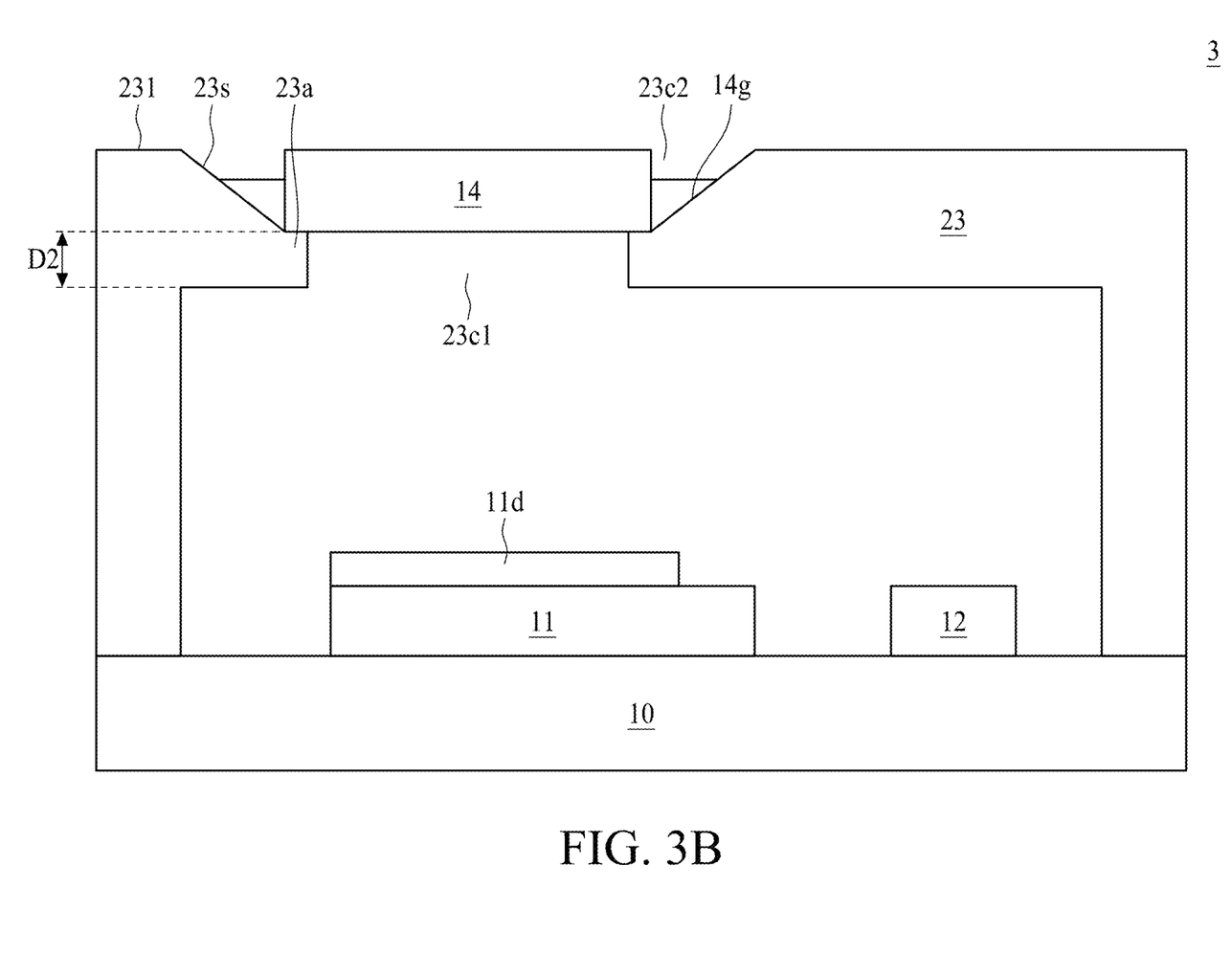
FIG. 3B illustrates a cross-sectional view of an optical device in accordance with some embodiments of the present disclosure.
Figure 3C:
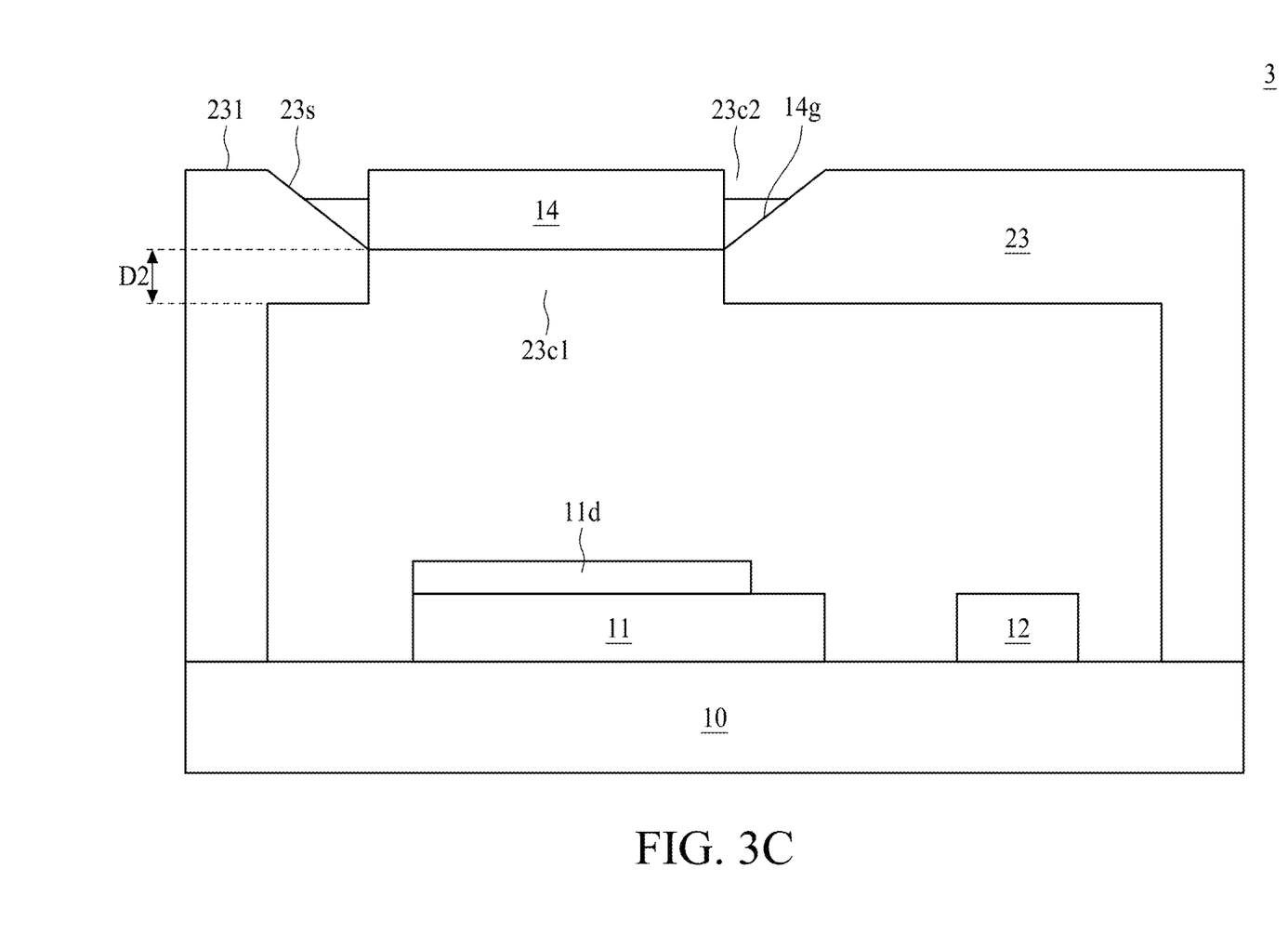
FIG. 3C illustrates a cross-sectional view of an optical device in accordance with some embodiments of the present disclosure.

FIG. 3A illustrates a top view of an optical device 3 in accordance with some embodiments of the present disclosure. FIG. 3B illustrates a cross-sectional view of the optical device 3 in FIG. 3A taken along the line B-B' and FIG. 3C illustrates a cross-sectional view of the optical device 3 in FIG. 3A taken along the line C-C', in accordance with some embodiments of the present disclosure. The optical device 3 illustrated in FIGS. 3A, 3B and 3C is similar to the optical device 1 illustrated in FIGS. 1A and 1B, and the differences therebetween are described below.

As shown in FIGS. 3A, 3B and 3C, a lid 23 of the optical 3 includes a slope 23s (or a lateral surface) connecting a top surface 231 of the lid 23 with the support structure 23a of the lid 23. The lid 23 defines a cavity (or opening, aperture) 23c1 over the light sensing area 11d of the electronic component 11. The lid 23 further defines a cavity 23c2 over the cavity 23c1. The sidewall (i.e., the slope 23s) of the cavity 23c2 is inclined. For example, the cavity 23c2 tapers from the top surface 231 of the lid 23 toward the cavity 23c1. For example, the top surface 231 of the lid 23 and the sidewall of the cavity 23c2 define an angle greater than 90 degrees. For example, the sidewall of the cavity 23c2 is not perpendicular to the top surface 231 of the lid 23. For example, the sidewall of the cavity 23c2 is not parallel to the sidewall of the cavity 23c1. The sidewall of the cavity 23c2 defines a guiding structure. The support structure 23a of the lid 23 has a bottom surface opposite to the top surface 231 of the lid 23. The bottom surface of the support structure 23a of the lid 23 is parallel to a top surface (on which the electronic component 11 is disposed) of the substrate 10. In some embodiments, a width of the cavity 23c2 is greater than a width of the cavity 23c1. In some embodiments, as shown in FIG. 3A, the support structure 23a is disposed at or adjacent to the corners of the cavity 23c1. For example, the support structure 23a is not disposed along the whole edges of the cavity 23c1. For example, as shown in FIG. 3C, which illustrates a cross-sectional view of the optical device 3 in FIG. 3A taken along the line C-C' (passing the center of the edges of the cavity 23c1), the support structure 23a is omitted. For example, the slope 23s (or an inclined sidewall) of the lid 23 connects the cavity 23c1 to the top surface 231 of the lid 23.

The light transmission element 14 is disposed within the cavity 23c2 and on the support structure 23a of the lid 23. As shown in FIG. 3C, the light transmission element 14 has bottom surface adjacent to the slope 23s (or an inclined sidewall) of the lid 23 and fully uncovered by the support structure 23a of the lid 23. A glue 14g is disposed between the light transmission element 14 and the slope 23s of the lid 23 to fasten or adhere the light transmission element 14 to the lid 23. In some embodiments, the glue 14g is disposed along the slope 23s of the lid 23. In some embodiments, the glue 14g is formed of or includes light absorbing materials or light reflection materials. The guiding structure (e.g., the slope 23s) of the lid 23 can facilitate the injection of the glue 14g. The glue 14g is spaced apart from the support structure 23a of the lid 23. The glue 14g is entirely overlapped with the slope 23s (or an inclined sidewall) of the lid 23 in a direction substantially perpendicular to the top surface (on which the electronic component 11 is disposed) of the substrate 10. Since there is no adhesive between the light transmission element 14 and the support structure 23a of the lid 23 (e.g., the light transmission element 14 is in contact with the support structure 23a), the tilt issue of the optical device 1 illustrated in FIGS. 1A and 1B can be eliminated. In addition, the lateral surface of the light transmission element 14 is covered (partially or fully) by the glue 14g, which would avoid the light from entering the light sensing area 11d through the lateral surface of the light transmission element 14.

In addition, as shown in FIGS. 3A, 3B and 3C, since the support structure 13a of the lid 13, which surrounds the cavity 13c1 as illustrated in FIGS. 1A and 1B is replaced by the guiding structure 23s, the difficulty or complexity for forming the lid 23 (which is formed by, for example, injection molding) can be reduced. Moreover, the thickness D2 of the support structure 23a can be reduced (e.g., from 300 μm to 200 μm or less) without the occurrence of the crack, which will facilitate the miniaturization of the optical device 3.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 μm of lying along a same plane, such as within 40 within 30 within 20 within 10 or within 1 μm of lying along the same plane. Two components can be deemed to be "substantially aligned" if, for example, the two components overlap or are within 200 within 150 within 100 within 50 within 40 within 30 within 20 within 10 or within 1 μm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical device, comprising:
    a lid disposed over a substrate and having a first opening;
    a support structure extending from a sidewall of the first opening of the lid; and
    an adhesive entirely overlapped with an inclined sidewall of the lid in a direction substantially perpendicular to a top surface of the substrate;
    wherein a bottom surface of the support structure is physically separated from the top surface of the substrate and parallel to the top surface of the substrate.

2. The optical device of claim 1, wherein the adhesive is spaced apart from a top surface of the support structure.

3. The optical device of claim 2, wherein a distance between the top surface of the support structure and the bottom surface of the support structure is constant and about 300 micrometers (μm).

4. The optical device of claim 2, wherein the adhesive is supported by the inclined sidewall of the lid and a lateral surface of a light transmission element adjacent to the first opening of the lid.

5. The optical device of claim 1, wherein the adhesive fully covers a lateral surface of a light transmission element adjacent to the first opening of the lid and spaced apart from a bottom surface of the light transmission element facing the support structure.

6. An optical device, comprising:
    a lid disposed over a substrate and having a top surface and an inclined sidewall that connects a first opening to the top surface;
    a support structure adjacent to the first opening of the lid; and
    a light transmission element disposed over the support structure;
    wherein from a cross-sectional view, a bottom surface of the light transmission element is adjacent to the inclined sidewall and fully uncovered by the support structure,
    wherein a lateral surface of the light transmission element is fully covered by an adhesive spaced apart from the support structure.

7. The optical device of claim 6, wherein from another cross-sectional view, the bottom surface of the light transmission element directly contacts the support structure, and the lateral surface of the light transmission element faces the inclined sidewall of the lid.

8. The optical device of claim 7, wherein the adhesive is non-overlapped with the support structure from the another cross-sectional view.

9. An optical device, comprising:
    a substrate; and
    a lid disposed over the substrate, wherein the lid has a top surface and an inclined sidewall that connects the top surface to a support structure, and wherein the inclined sidewall defines a first cavity; and
    an adhesive disposed over the inclined sidewall of the lid and spaced apart from the support structure,
    wherein the support structure defines a second cavity under the first cavity, and wherein from a cross-sectional view, the inclined sidewall is connected with the second cavity through a top surface of the support structure uncovered by the adhesive, and wherein in another cross-sectional view, the inclined sidewall is connected with the second cavity without the top surface of the support structure connected therebetween.

10. The optical device of claim 9, wherein from the top view, a number of sides of the second cavity is greater than a number of sides of the first cavity.

11. An optical device, comprising:
a lid disposed over a substrate and having a top surface and an inclined sidewall that connects a first opening to the top surface;
a support structure adjacent to the first opening of the lid; and
a light transmission element disposed over the support structure;
wherein from a cross-sectional view, a bottom surface of the light transmission element is adjacent to the inclined sidewall and fully uncovered by the support structure,
wherein the support structure is not disposed along an edge of the first opening, and from the cross-sectional view, the inclined sidewall defines a second opening that tapers from the top surface of the lid toward the edge of the first opening.

12. The optical device of claim 11, wherein a lateral surface of the light transmission element is aligned with the edge of the first opening and the inclined sidewall of the lid surrounds the edge of the first opening from a top view.

13. An optical device, comprising:
a lid disposed over a substrate and having a top surface and an inclined sidewall that connects a first opening to the top surface;
a support structure adjacent to the first opening of the lid; and
a light transmission element disposed over the support structure;
wherein from a cross-sectional view, a bottom surface of the light transmission element is adjacent to the inclined sidewall and fully uncovered by the support structure,
wherein an edge of the inclined sidewall of the lid is aligned with the lateral surface of the light transmission element and surrounds the light transmission element from a top view.

* * * * *